(12) United States Patent
Renault et al.

(10) Patent No.: US 8,089,044 B2
(45) Date of Patent: Jan. 3, 2012

(54) METHOD FOR CORRECTING ASTIGMATISM IN ELECTRON EMISSION SPECTROMICROSCOPY IMAGING

(75) Inventors: Olivier Renault, Saint Pancrasse (FR); Maylis Lavayssiere, Grenoble (FR); Denis Mariolle, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 214 days.

(21) Appl. No.: 12/638,311

(22) Filed: Dec. 15, 2009

(65) Prior Publication Data
US 2010/0200747 A1    Aug. 12, 2010

(30) Foreign Application Priority Data
Feb. 11, 2009 (FR) ...................................... 09 50841

(51) Int. Cl.
*H01J 37/00* (2006.01)
*H01J 37/153* (2006.01)

(52) U.S. Cl. ........ 250/305; 250/306; 250/309; 250/310; 250/397; 250/491.1; 250/492.1; 250/492.22

(58) Field of Classification Search .................. 250/396, 250/397, 398, 491.1, 492.22, 305, 306, 309, 250/310
See application file for complete search history.

(56) References Cited

U.S. PATENT DOCUMENTS

| | | | |
|---|---|---|---|
| 4,758,723 A * | 7/1988 | Wardell et al. ................ 250/305 |
| 4,978,855 A * | 12/1990 | Liebl et al. .................... 250/310 |
| 6,465,781 B1 * | 10/2002 | Nishimura et al. ........... 250/306 |
| 6,593,152 B2 * | 7/2003 | Nakasuji et al. ................ 438/14 |
| 7,019,294 B2 * | 3/2006 | Koyama et al. ............... 250/311 |
| 7,075,072 B2 * | 7/2006 | Hatakeyama et al. ........ 250/310 |
| 7,126,120 B2 | 10/2006 | Inada |
| 7,129,485 B2 * | 10/2006 | Nakasuji et al. ............... 250/310 |
| 7,608,838 B1 * | 10/2009 | Browning .............. 250/396 ML |
| 7,928,378 B2 * | 4/2011 | Kimba et al. .................. 250/307 |
| 7,935,559 B1 * | 5/2011 | Giffard et al. ................... 438/69 |
| 2004/0004773 A1 | 1/2004 | Khursheed |

(Continued)

FOREIGN PATENT DOCUMENTS
JP    2004-265652    9/2004
(Continued)

OTHER PUBLICATIONS

S. Halas, "100 years of work function", Materials Science-Poland, vol. 24, No. 4, 2006, pp. 951-968.

(Continued)

*Primary Examiner* — David A Vanore
(74) *Attorney, Agent, or Firm* — Oblon, Spivak, McClelland, Maier & Neustadt, L.L.P.

(57) ABSTRACT

A method for correcting astigmatism of an electronic optical column of an electron emission spectromicroscope, comprising the steps of:
  forming a reference structure on a surface of a sample comprising a structure of interest to be imaged,
  imaging the reference structure by the spectromicroscope with secondary electrons and with core level photoelectrons,
  eliminating astigmatism defects appearing during the imaging of the reference structure with secondary electrons and with core level photoelectrons,
  a material of the reference structure being chosen such that, during core level photoelectron imaging, the contrast C between the average intensity $I_a$ of the material of the reference structure and the average intensity $I_b$ of the material of the sample is such that:

$$C = \frac{I_a - I_b}{I_a + I_b} \geq 0.2.$$

15 Claims, 4 Drawing Sheets

U.S. PATENT DOCUMENTS

2004/0114132 A1    6/2004    Den Boef et al.
2010/0200747 A1*   8/2010    Renault et al. ............... 250/307

FOREIGN PATENT DOCUMENTS

WO    WO 2008/082000 A1    7/2008

OTHER PUBLICATIONS

D. Dunham, et al., "Evaluation of aberration coefficients of practical electrostatic lenses for X-ray absorption micro-spectroscopy and imaging", Nuclear Instruments & Methods in Physics Research Section A, vol. 347, 1994, pp. 441-445.

Claus M. Schneider, et al., "Investigating surface magnetism by means of photoexcitation electron emission microscopy", Reports on Progress in Physics, vol. 65, 2002, pp. R1785-R1839.

S. Günther, et al., "Photoelectron microscopy and applications in surface and materials science", Progress in Surface Science, vol. 70, 2002, pp. 187-260.

M. Escher, et al., "NanoESCA: a novel energy filter for imaging x-ray photoemission spectroscopy", Journal of Physics: Condensed Matter, vol. 17, 2005, pp. S1329-S1338.

O. Renault, et al., "Energy-filtered XPEEM with *NanoESCA* using synchrotron and laboratory X-ray sources: Principles and first demonstrated results", Surface Science, vol. 601, 2007, pp. 4727-4732.

O. Renault, et al., "Work-function imaging of oriented copper grains by photoemission", Surface and Interface Analysis, vol. 38, 2006, pp. 375-377.

S. A. Nepijko, et al., "Resolution deterioration in emission electron microscopy due to object roughness", Ann. Phys., vol. 9, 2000, pp. 441-451.

G. Schönhense, et al., "Correction of chromatic and spherical aberration in electron microscopy utilizing the time structure of pulsed excitation sources", Journal of Vacuum Science & Technology B, vol. 20(6), Nov./Dec. 2002, pp. 2526-2534.

J. J. Yeh, et al., "Atomic Subshell Photoionization Cross Section and Asymmetry Parameters: $1 \leq z \leq 103$", Atomic Data and Nuclear Data Tables, vol. 32, No. 1, Jan. 1985, pp. 1-155.

* cited by examiner

METHOD FOR CORRECTING ASTIGMATISM IN ELECTRON EMISSION SPECTROMICROSCOPY IMAGING

TECHNICAL FIELD

This document relates to the field of spectromicroscopy imaging, and more specifically that of the correction of defects, particularly astigmatism, of an electronic optical column of an electron emission spectromicroscope, for example with photo-excited electron or photoelectron emission. It particularly applies to the field of full-field XPS (X-ray Photoelectron Spectromicroscopy) imaging.

STATE OF THE PRIOR ART

Spectromicroscopy, which combines electron spectroscopy and microscopy, is an imaging technique consisting in irradiating a large surface of a sample to be imaged by a wide beam having a certain energy. When said beam is an X-ray beam, it is known as XPS imaging. This technique uses the principle of the photoelectric effect concerning some of the electrons of the atoms of the material of the sample to be imaged. When a photon interacts with an electron from one of the electron shells of an atom of the sample material, said photon transfers to it its initial energy. Part of this energy enables the electron to perform a transition from its initial orbital to the vacuum level. This energy corresponds to the binding energy of the electron. The residual energy is transmitted to the electron in the form of kinetic energy. By measuring this kinetic energy by means of an energy analyser, also known as energy filter, and knowing the energy of the incident radiation, it is possible to deduce from this the binding energy of the ejected electron and thus characterise the nature of the sample in terms of chemical elements.

A full-field spectromicroscopy is performed by means of an electronic optical column and an energy analyser. The column collects and images all of the electrons ejected from the surface of the sample by photoelectric effect. The photoelectrons are collected by the column by means of a strong electric field generated between the sample and the objective of the column, known as extraction electric field. The energy analyser, for example of hemispheric type, performs an energy filtering of the image produced by the column by selecting over a very small energy interval the electrons transmitted by the column.

Various factors limiting the lateral resolution exist (resolution of the image in the plane of the sample) in electron emission imaging, for example in PEEM.

Firstly, the physical topography of the sample plays an important role in the quality of the image obtained. Indeed, if the surface of the sample is rough, these irregularities will disrupt the extraction electric field generated between the sample and the objective, which has the effect of deflecting the path of the photoelectrons emitted, leading to over-intensities and under-intensities in the image obtained. The samples must therefore have a surface as flat as possible in order to reduce these defects due to topographies of the sample.

Spherical and chromatic aberrations, due both to the extraction electric field and to the electrostatic lenses of the objective themselves, are also defects that limit resolution in electron emission imaging. Spherical aberrations have the effect that, for a same kinetic energy, photoelectrons that present a wide angle with the optical axis do not focus in the focal plane. The use of a diaphragm makes it possible to limit the maximum photoelectron collection angle, but on the other hand reduces the intensity transmitted by the column. Chromatic aberrations stem for their part from the fact that photoelectrons having a similar angle in relation to the optical axis may have different kinetic energies and are thus not going to focus in the same plane.

It is possible to correct these spherical and chromatic aberrations by resorting to different instruments: electronic mirrors, hexapole, etc.

Astigmatism is also a factor that limits lateral resolution in PEEM imaging. Indeed, the PEEM column does not have a perfect optical axis, these imperfections generally being misalignments between the lenses or instead residual magnetic fields. The lenses themselves are not perfect either, and often their transmission around the optical axis is not symmetrical. The focal distance around the optical axis can thus vary depending on the direction of observation. The electron paths do not focus in the same way in a plane parallel to the optical axis and a plane perpendicular to the optical axis: the vertical components focus at a shorter distance in a plane known as tangential plane, and the horizontal components focus at a greater distance, in a plane known as sagittal plane. In this way, the images will appear deformed. For example, a square will appear rectangular and a circle will appear ellipsoidal when located around the image focal point. This astigmatism results in a reduction in the quality of the images obtained (reduction in the lateral resolution, the contrast, etc.), and the correct focusing voltage that needs to be applied is difficult to find.

Document U.S. Pat. No. 7,126,120 B2 discloses a method for correcting the astigmatism of an electronic optical column, for example of a spectromicroscope, wherein an evaluation of the astigmatism of the column then a correction of said astigmatism are carried out by playing by iterations on the control currents of a deflector/stigmator of the column, which may be an electrostatic octopole that enables the astigmatism in all directions to be corrected.

FIG. 1A represents a circular pattern imaged without astigmatism in the optic of a microscope. In contrast, FIG. 1B represents this same imaged pattern with deformations due to a pronounced astigmatism in different directions. It may be seen in this FIG. 1B that the astigmatism can result in deformations along parallel and perpendicular directions in relation to the X axis (0° and 90° in relation to the X axis), which may be corrected by playing on the control voltage of the Sx axis of the stigmator of the column, and deformations along directions at 45° and 135° in relation to the X axis, which may be corrected by playing on the control voltage of the Sy axis of the stigmator of the column.

Such a method nevertheless has the major drawback of not being able to apply in practice for numerous samples because the structures of interest of these samples that it is wished to image generally have a pattern that does not make it possible to clearly highlight the astigmatism defects of the column. For example, in the case of a sample in which the structure of interest that it is wished to image is composed of horizontal strips, it will be impossible to evaluate and to correct the astigmatism in this horizontal direction parallel to the orientation of the strips of the structure of interest of the sample.

DESCRIPTION OF THE INVENTION

Thus there is a need to optimise the observation conditions during a method of electron emission spectromicroscopy imaging, for example with photoelectrons, of a structure of interest of a sample by correcting defects of the electronic optical column of a spectromicroscope, and particularly astigmatism.

To do this, one embodiment proposes a method for correcting astigmatism of an electronic optical column of an electron emission spectromicroscope, comprising at least the steps of:

forming a reference structure on a surface of a sample comprising a structure of interest to be imaged, the dimensions of the exterior contour of the reference structure, along two axes perpendicular to each other and lying in a plane parallel to the surface of the sample, being substantially similar, imaging the reference structure by the spectromicroscope with secondary electrons and with core level photoelectrons, eliminating astigmatism defects appearing during the imaging of the reference structure with secondary electrons and with core level photoelectrons, the material of the reference structure being chosen such that, during an observation with core level photoelectrons, the contrast C between the average intensity $I_a$ of the material of the reference structure and the average intensity $I_b$ of the material of the sample is such that:

$$C = \frac{I_a - I_b}{I_a + I_b} \geq 0.2.$$

Here, and throughout the remainder of the document, "average intensity" is taken to mean the average value of the light intensity of the pixels in the image for a given area.

The elimination of astigmatism defects may be carried out by an adjustment of a control voltage of a stigmator of the spectromicroscope, then an adjustment of a focusing voltage of the spectromicroscope.

A reference structure that can be imaged with secondary electrons or with core level photoelectrons is thus formed on the surface of the sample to be studied. Thanks to the use of the reference structure, which is formed on the sample comprising the structure of interest that it is wished to image, it is possible to correct the astigmatism of the column of the spectromicroscope whatever the geometry (shape, dimensions, etc.) of the structure of interest to be imaged, and particularly when the structure of interest comprises elements extending longitudinally, for example strips, which cannot be used alone to correct the astigmatism of the column of the spectromicroscope. Imaging, for example of XPS type, of the structure of interest may thus be carried out at high lateral resolution.

The reference structure may thus comprise a single portion of material, for example of disc shape or another geometric shape.

The reference structure may comprise a plurality of portions of the material of the reference structure forming concentric patterns of different sizes and separated from each other by a non-zero distance.

Thus, by using the different patterns of the reference structure, it is possible to correct astigmatism defects appearing on fields of view of different sizes: large, in other words for example between around 600 μm and 100 μm; medium, in other words for example between around 100 μm and 25 μm; or small, in other words for example less than around 25 μm. The user thus only has to adjust the magnification of the spectromicroscope to observe these different patterns and correct the astigmatism defects for fields of view that are of interest.

The exterior contours of the portions of material of the reference structure may be homothetic to each other and/or extend 360° around the centre of the reference structure.

Thus, the reference structure may comprise several geometric patterns (squares, discs, etc.) overlapping each other, facilitating for the user a visual appreciation (qualitative) of the presence of astigmatism.

The patterns of the portions of material of the reference structure may comprise geometric patterns arranged within each other, or comprise a grid or spiral pattern (a grid and a spiral that can be broken down into several concentric patterns and separated from each other by a non-zero distance).

For example, the patterns of the portions of material of the reference structure may comprise rings.

The patterns of the portions of material of the reference structure may comprise different widths (dimensions of the portions of material in the plane of the substrate).

The dimensions of the exterior contour of the reference structure may be chosen as a function of the field of view of the spectromicroscope used for the correction of astigmatism and may be, for example, at least equal to around $\frac{1}{25}^{th}$ of the size of the field of view of the spectromicroscope. For example, for fields of view less than around 127 μm, the dimensions of the exterior contour of the reference structure may be between around 2 μm and 10 μm. For a field of view between around 20 μm and 127 μm, these dimensions may be between around 5 μm and 10 μm, for example equal to around 10 μm. For a field of view less than around 20 μm, for example equal to around 18 μm, these dimensions may be around 2 μm and 5 μm, and for example equal to around 5 μm. By choosing to form a reference structure of sufficient dimensions, for example at least equal to around $\frac{1}{25}^{th}$ of the size of the field of view of the spectromicroscope, the correction of the astigmatism is facilitated by retaining the possibility of working with a good counting statistic at the typical field of view used by the spectromicroscope with core level photoelectrons, particularly when the spectromicroscope is configured in wide field of view (observation window equal to around 200 μm for example) and core level photoelectron imaging.

In addition, when it is wished to correct the astigmatism on the core levels, given that the probability of excitation of the core level photoelectrons is lower than that of the secondary electrons, such dimensions make it possible to form a large enough reference structure that can be imaged easily. For instance, the spectromicroscope with core level photoelectrons may be used with an excitation source of limited brilliance by choosing on the one hand a sufficiently wide field of view to enable a sufficient counting statistic and, on the other hand, a reference structure having a large enough surface, for example greater than around $\frac{1}{25}^{th}$ of the size of the field of view, which makes it possible to reduce the acquisition time of the image and thus make it possible to carry out the acquisition of a greater number of images to refine the adjustment of the astigmatism.

In the case of an imaging instrument for example of the XPS type, its spatial resolution varies as a function of the energy of the radiation used. The distance between the portions of material of the reference structure and/or the width (dimension along one of the two axes perpendicular to each other and lying in the plane parallel to the surface of the sample) of the portions of material of the reference structure may be greater than or equal to around two times, or between around 1.5 times and 2.5 times, the best spatial resolution of the spectromicroscope during an observation of the structure of interest.

In order to obtain a contrast greater than or equal to around 0.2, it is necessary to form the reference structure in a suitable material compared to the material of the sample on which is formed the reference structure. To do this, the material of the reference structure may be chosen such that its elementary composition differs markedly from that of the material of the sample.

Thus, the difference between the work function of the material of the reference structure and the work function of the material of the sample may be greater than or equal to around 0.2 eV and/or, when the materials of the reference structure and the sample are based on at least one same element, the concentration of this element in the material of the reference structure may be different from the concentration of this element in the material of the sample and/or, when the materials of the reference structure and the sample are of the same nature, said materials may be doped differently.

Advantageously, it is possible to choose the material of the reference structure such that a core level photoelectron of at least one constituent element of it has a high cross section as a function of the energy of the excitation beam used during the observation of the sample. The material of the reference structure may be chosen such that the cross section of a core level photoelectron of at least one constituent element of the material of the reference structure is greater than or equal to around 0.1 Mbarn (1 Mbarn=$10^{-22}$ m$^2$). By choosing a material having such a cross section, a good probability of photoexcitation of the core level electrons of the material of the reference structure is guaranteed.

The material of the reference structure may be such that the kinetic energy of the core level photoelectrons used for imaging at least one of the constituent elements of said material is less than or equal to around several hundred eV, or less than around 1000 eV. For instance, by choosing a material in which the photoelectrons to be imaged may be excited in such a way that their kinetic energy is low (the kinetic energy depending on the energy of the excitation beam), their transmission by the spectromicroscope is improved, improving the contrast obtained between the material of the reference structure and the material of the sample.

The material of the reference structure may to electrically conductor or semi-conductor. By using charge compensation devices, the material of the reference structure may be a dielectric.

The formation of the reference structure may comprise at least one step of localised deposition of the material of the reference structure on the sample at a distance greater than around 100 µm from the structure of interest in order to avoid any deterioration of the structure of interest, and a step of machining the deposited material, forming the reference structure.

In this case, the material of the reference structure may be deposited over a substantially uniform thickness between around 15 nm and 200 nm, and advantageously less than around 30 nm and/or the machining may be carried out over a depth greater than around 1 nm or 2 nm in the thickness of the deposited material.

The method for correcting astigmatism may further comprise, before the implementation of a step of imaging the reference structure by the spectromicroscope with core level photoelectrons then a step of eliminating astigmatism defects appearing during core level photoelectron imaging of the reference structure, a step of imaging the reference structure by the spectromicroscope with secondary electrons, then a step of eliminating astigmatism defects appearing during the secondary electron imaging of the reference structure.

An elimination of astigmatism defects appearing during the imaging of the reference structure with secondary electrons or with core level photoelectrons may be carried out by an adjustment of the control voltages of a stigmator of the column then by an adjustment of the focusing voltage of the spectromicroscope.

Another embodiment concerns a method of electron emission spectromicroscopy imaging, comprising the implementation of a method for correcting astigmatism as described above, and one or more steps of imaging the structure of interest with secondary electrons and/or with core level photoelectrons.

BRIEF DESCRIPTION OF DRAWINGS

The present invention will be better understood on reading the description of embodiments given purely by way of indication and in no way limiting and by referring to the appended drawings, in which.

Identical, similar or equivalent parts of the different figures described hereafter bear the same numerical references so as to make it easier to go from one figure to the next.

In order to make the figures easier to read, the different parts in the figures are not necessarily represented at a uniform scale.

The different possibilities (alternatives and embodiments) should be understood as not being mutually exclusive of each other and may be combined together.

DETAILED DESCRIPTION OF SPECIFIC EMBODIMENTS

Figure 1A:
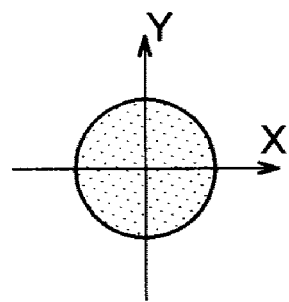
FIG. 1A schematically represents a circular pattern imaged without astigmatism in the optic of a microscope, and FIG. 1B schematically represents this same pattern imaged with deformations due to a pronounced astigmatism in different directions.
Figure 1B:
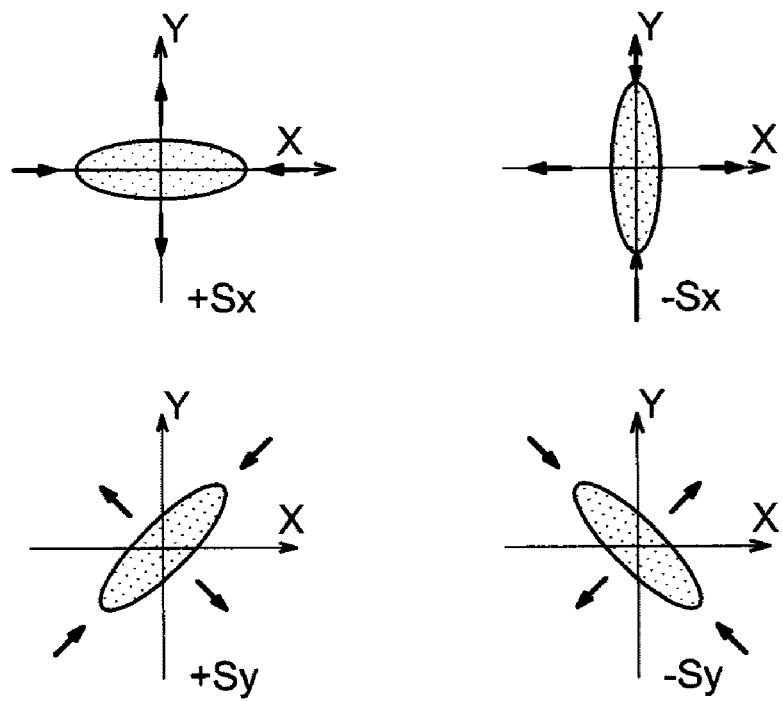
Figure 2:
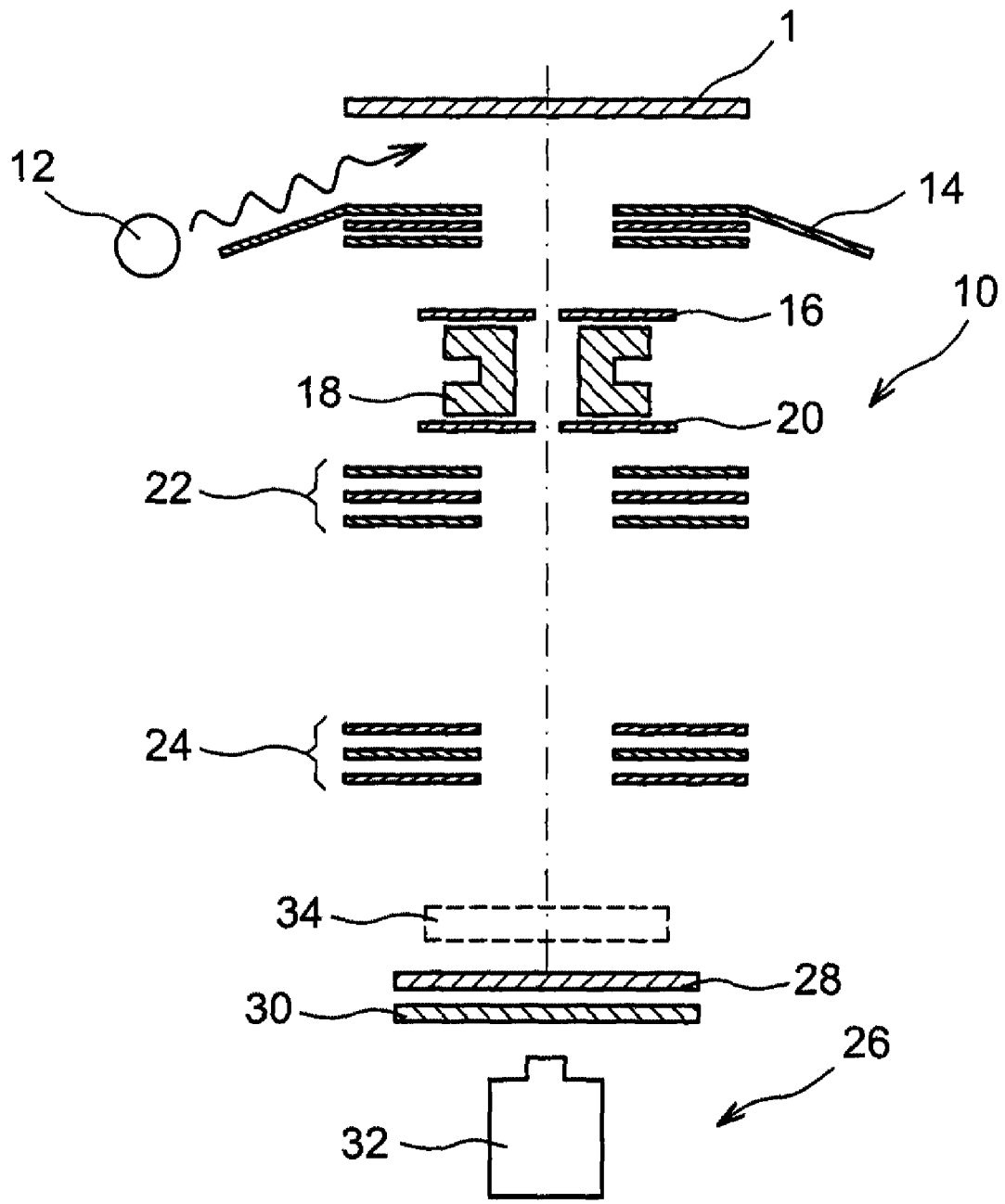
FIG. 2 represents an example of electronic optical column of an electron emission spectromicroscope, for example with photoelectrons, used in an imaging method, according to one embodiment.
Figure 3:
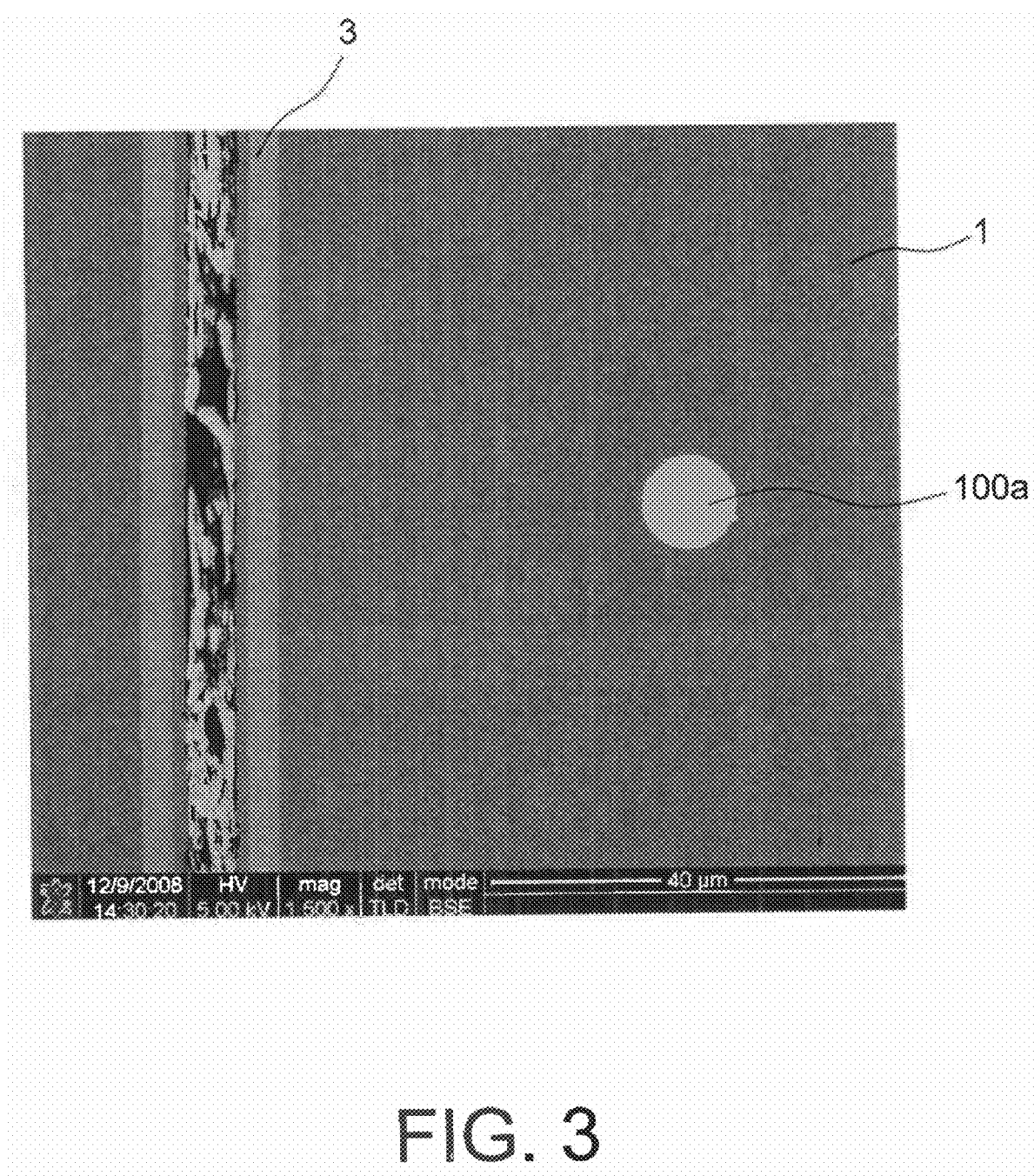
FIG. 3 represents an example of sample comprising a structure of interest and a reference structure imaged during an imaging method, according to one embodiment.

Reference will firstly be made to FIG. 2, which represents an electronic optical column 10 of a spectromicroscope, which is here a PEEM column used for the implementation of a method of full-field XPS imaging of a sample 1, represented in FIG. 3 in a field of view of around 85 µm, on which there is a reference structure 100a of disc shape and a structure of interest 3 that it is wished to image. In the example described here, the structure of interest 3 is a straight section of a stack of epitaxied layers of silicon and silicon-germanium, and thus does not comprise any pattern that makes it possible to carry out an estimation and a correction of the astigmatism of the column 10 from this single structure of interest 3.

The spectromicroscope also comprises an energy source 12, here an X-ray emitter, making it possible to excite by photoelectric effect the atoms of the materials of the sample 1 receiving its radiation. The optical system of the column 10 is composed entirely of electrostatic elements. The column 10 performs a collection of the photoelectrons ejected from the sample 1 by means of a strong electric field, for example equal to around 7 kV·mm$^{-1}$, applied between the surface of the sample 1 and a first electrode of an immersion lens, known as extractor, which forms the first element of the column 10. Said extractor is coupled to a focusing lens and forms a part of a lens-objective 14 of the column 10.

The column 10 further comprises a contrast aperture 16 that makes it possible to limit the maximum angular aperture of photoelectrons and at the level of which the backfocal plane is formed. The column 10 then comprises a system for correcting astigmatism and adjusting deflection known as deflector/stigmator 18, and an area selection diaphragm 20 in which an intermediate image is formed. The column 10 then comprises several projective lenses 22 and 24 that magnify the intermediate image to give a final image.

The column 10 further comprises a detector 26 comprising an MCP (Micro Channel Plate) 28 carrying out an amplification of the image by acting on the photoelectrons, and a fluorescent screen 30 converting the electronic image into light detectable by a CCD camera 32. As represented in the example of FIG. 2, the spectromicroscope 10 may also comprise an image delay filter 34 arranged between the detector 26 and the projective lenses 22 and 24.

An example of method of full-field XPS imaging of the sample 1 implemented with the column 10 will now be described. During this method, the astigmatism of the column 10 with core level photoelectrons and, even more so, with secondary electrons, is corrected thanks to a reference structure 100 formed on the surface of the sample 1 beside the structure of interest 3, one example of which is represented in FIG. 4.

Figure 4:
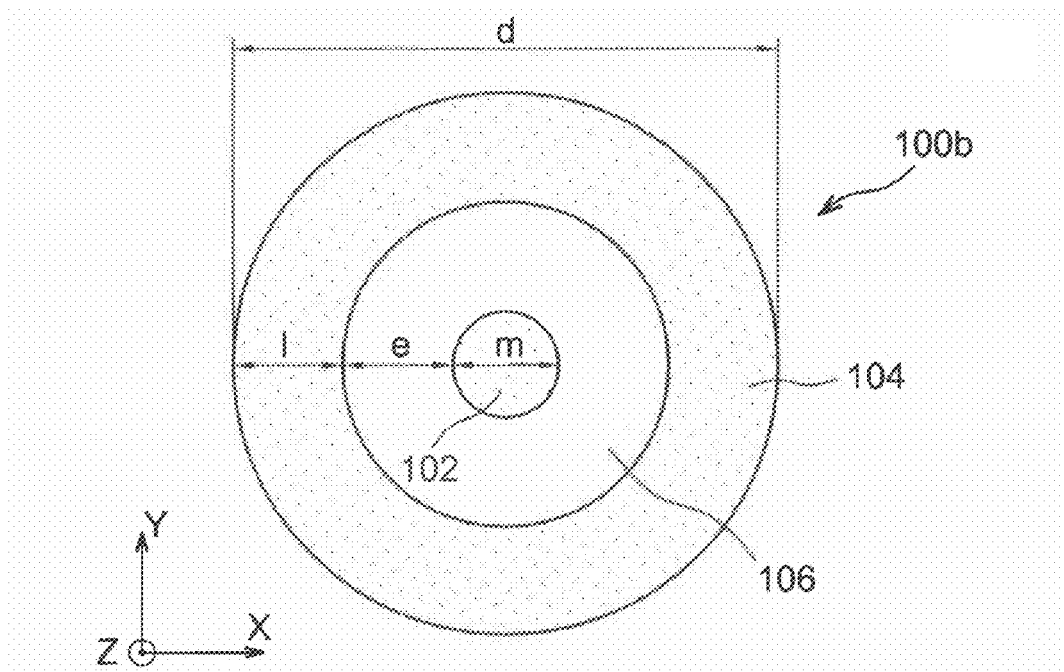
FIG. 4 represents an example of a reference structure formed and used during an imaging method, according to one embodiment.

In the example of FIG. 4, a reference structure 100b comprises a first portion of material forming a block 102, the shape of which, in the plane of the surface of the sample 1, corresponding to the plane (X,Y) represented in FIG. 4, is a disc. The reference structure 100b further comprises a second portion of material 104 surrounding the block 102 and comprising in the plane (X,Y) a ring shape. The block 102 and the ring 104 are concentric and separated from each other by a non-zero distance "e", forming a space between the block 102 and the ring 104 in which a portion 106 of the surface of the sample 1 is not covered by the material of the reference structure 100b, and thus visible by the column 10. This portion 106 comprises in the plane (X,Y) a ring shape surrounding the block 102.

The general size of the reference structure 100b, in other words the dimensions of the exterior contour of the reference structure 100b in the plane of the surface of the sample 1, here corresponding to the exterior diameter referenced "d" of the ring shaped portion 104, is greater than around $\frac{1}{25}^{th}$ of the field of view of the spectromicroscope, and for example equal to around 10 μm for a field of view of around 90 μm. Depending on the field of view, it is also possible that the general size of the reference structure 100b is less than around $\frac{1}{25}^{th}$ of the field of view. This reference structure 100b thus offers a large enough surface compatible with a correction of astigmatism with core level photoelectrons as well as with secondary electrons for different fields of view.

The spacing between the different portions of material of the reference structure 100b, as well as the width (dimension in the plane of the surface of the sample 1, in other words in the plane (X,Y)) of these portions, are chosen as a function of the spatial resolution of the observation instrument, namely the electronic optical column 10. In the example of FIG. 4, this spacing corresponds to the gap, referenced "e" in FIG. 4, separating the block 102 from the ring portion 104. This gap "e", as well as the width of the ring portion 104 referenced "l" and the diameter "m" of the block 102 are chosen equal to around twice, or between around 1.5 times and 2.5 times, the best practical spatial resolution obtained on samples by the spectromicroscope, depending on the energy of the incident radiation.

For example, in the case of a "NanoESCA" type spectromicroscope, by using a laboratory AlKα type X-ray source at around 1486.7 eV, the best spatial resolution measured is equal to around 500 nm. The gap "e", the width "l" and the diameter "m" are thus chosen at least equal to around 1 μm. By using a soft X-ray type source such as synchrotron radiation at around 250 eV, the best spatial resolution measured is equal to around 100 nm. The gap "e", the width "l" and the diameter "m" are chosen in this case at least equal to around 200 nm. Finally, by using a laboratory type UV source, for example mercury discharge, equal to around 4.9 eV, the spatial resolution is in this case equal to around 40 nm. The gap "e", the width "l" and the diameter "m" are thus chosen at least equal to around 80 nm.

The material of the reference structure 100b, in other words the material of the portions 102 and 104, is chosen as a function of that of the sample 1 on which is formed the reference structure 100b, in order to have a good contrast with the material of the sample 1. The material of the reference structure 100b is chosen such that the contrast C between the average intensity $I_a$ of the material of the portions of the reference structure 100b and the average intensity $I_b$ of the material of the sample 1, is such that:

$$C = \frac{I_a - I_b}{I_a + I_b} \geq 0.2.$$

Such a contrast may be obtained by choosing to form the reference structure 100b from a material chemically dissimilar to the material of the sample 1 having a difference in work function compared to the work function of the material of the sample 1. Indeed, this difference in work function implies that the local electron structures of the material of the reference structure 100b, from which the portions 102 and 104 are formed, and the material of the sample 1 are different. The probability of photo-excitation and the energy threshold beyond which electrons are emitted (photoemission threshold) are thus, for the material of the reference structure 100b, different from those of the material of the sample 1, which results in a difference in intensity on the image obtained, corresponding to the contrast between the two materials. The material of the reference structure 100b may in particular be chosen such that it has a photoemission threshold different to that of the sample 1, for example such that the work functions of these materials differ by at least 0.2 eV. In the case of a sample 1 based on silicon, the material of the reference structure 100b is for example chosen among tungsten, germanium, gallium or instead titanium. In addition, the materials of the sample 1 and the reference structure 100b may be chosen such that the values of the work functions of these materials are lower than the energy of the excitation source when it involves a low energy excitation, for example a UV source. The values of the work function of each material are for example described in the document "100 years of work function" by S. Halas, Materials Science-Poland, Vol. 24, N° 4, 2006.

In an alternative, a difference in contrast between the material of the sample 1 and the material of the reference structure 100b may also be obtained by varying the concentration of an element common to these materials. For example, the sample 1 could be based on GaAs and the reference structure 100b based on $Al_xGa_{1-x}As$. In another alternative, a difference in contrast may also be obtained by varying the doping level of one of the two materials compared to the other, for example when said materials are semi-conductors. It is for example possible to have the sample 1 based on n-doped silicon and a reference structure 100b based on p-doped silicon.

Given that a correction of astigmatism of the column 10 with core level photoelectrons is carried out in this method, it is also wished to maximise the intensity of the images and the contrast between the surface of the sample 1 and the reference structure 100b with core level photoelectrons in order to have sufficient ionised electrons and thereby obtain images with core level photoelectrons with a relatively short acquisition time (several minutes at the most).

In the case of an observation with core level photoelectrons, the intensity of the contrast is proportional to the flux of photons arriving at the surface of the sample 1. By making use of synchrotron radiation, it is possible to ensure this flux of photons is maximised in order to maximise the intensity of the contrast in the images obtained with core level photoelectrons.

The material of the reference structure 100b is here also chosen as a function of the incident radiation with which the surface of the sample 1 is examined. Indeed, we are here interested in the cross section parameter of the material, which corresponds to the probability of photoexcitation of a given electron shell, for a given element of the material and a given photon energy. This cross section thus depends at one and the same time on the element considered, the electron shell considered and also on the incident energy of the photons. In the present case, the material of the reference structure 100b is chosen such that the core level photoelectrons of an element constituting this material have a cross section equal to at least 0.1 Mb.

Finally, the material of the reference structure 100b is chosen as a function of the kinetic energy of its core level photoelectrons. One aims in this way to image core levels for which the kinetic energy of the core photoelectrons is as low as possible, for example equal at the most to several hundreds of eV or less than around 1000 eV. Indeed, the transmission T of the column 10 varies proportionally and inversely to the kinetic energy of the photoelectrons $E_k$ such that:

$$T \propto \frac{r_{ap}^2}{E_k},$$

where $r_{ap}$ is the contrast aperture radius 16 of the column 10.

Thus, for materials in which the core level photoelectrons have a good cross section ($\geq 0.1$ Mb), elements having a high binding energy and thus a low kinetic energy (<200 eV) are preferred, so as to improve the transmission. The table below gives values of cross sections and the kinetic energy relative to different materials irradiated by an excitation beam of X-rays at 1486.7 eV. The "line" column corresponds to the imaged photoelectrical transitions.

| Material | Line | Cross Sec. (Mb) | Kinetic energy (eV) |
|---|---|---|---|
| Ga | $2p_{3/2}$ | 0.44 | 370 |
| Ge | $2p_{3/2}$ | 0.49 | 270 |
| As | $2p_{3/2}$ | 0.56 | 163 |
| Fe | $2p_{3/2}$ | 0.22 | 777 |
| Co | $2p_{3/2}$ | 0.26 | 708 |
| Ni | $2p_{3/2}$ | 0.30 | 632 |
| Cu | $2p_{3/2}$ | 0.34 | 556 |
| Zn | $2p_{3/2}$ | 0.39 | 466 |
| Mn | $2p_{3/2}$ | 0.19 | 846 |
| Au | $4f_{7/2}$ | 0.25 | 1402 |
| Ag | $3d_{5/2}$ | 0.25 | 1121 |

Finally, the material of the reference Structure 100b may also be chosen such that said material has a core level binding energy close to that of the material of the sample 1 so as to maximise the transmission of the spectromicroscope.

Finally, the material of the reference structure 100b may be chosen among non-electrically insulating materials, in other words among conductor or semi-conductor materials, to avoid charge effects, and which do not degas under ultra-high vacuum (pressure less than around $10^{-7}$ Pa).

An example of method will now be described that enables the material from which the reference structure 100b will be formed to be chosen.

In order to carry out a correction of the astigmatism with secondary electrons, as a function of the energy of the excitation beam, which is known, materials having a difference in work function at least equal to around 0.2 eV with that of the sample 1 are determined.

If the correction of astigmatism that can be obtained with a reference structure formed from any of these materials is sufficient, one of these materials is chosen to form the reference structure 100b.

If the correction of astigmatism with secondary electrons is not sufficient and if it is wished to be able to correct the astigmatism with core level photoelectrons, as a function of the energy of the excitation beam, which is known, among the materials chosen previously, materials are selected in which the core level photoelectrons have a cross section greater than or equal to around 0.1 Mb.

Preferably, among this new selection of materials, are then selected that or those having a good contrast with that of the sample 1 (greater than or equal to 0.2), as well as a transition photoelectric of low kinetic energy (for example less than around 200 eV) and close to that of the material of the structure of interest 3.

Once the material of the reference structure 100b has been chosen, the reference structure 100b is then formed.

The material of the reference structure 100b is deposited by localised deposition techniques, for example of FIB (focused ion beam) type, and then machined to form the concentric portions 102, 104 of the reference structure 100b. The instrument carrying cut the deposition is itself corrected for astigmatism defects so as not to induce distortions in the reference structure 100b formed.

The reference structure 100b is deposited rear to the structure of interest 3, for example at several tens of microns, or at the most at around 500 μm from the structure of interest 3. Indeed, given that it is sought to correct aberrations, in other words to align as best as possible the elements of the optical column 10, it is preferable to reduce as much as possible the distance separating the reference structure 100b from the structure of interest 3 in order to limit the shift in going from imaging the reference structure 100b to imaging the structure of interest 3, after having carried out the correction of the astigmatism using the reference structure 100b, and thereby limiting the chances of misaligning the optical column 10 and once again introducing aberrations. Thus, by compensating the astigmatism on the reference structure 100b, given that the structure of interest 3 is close, a minimisation of the correction of residual aberrations on the area of the structure of interest 3 to be imaged is ensured.

The fact that by depositing on the surface of the sample 1 the material of the reference structure 100b, whatever the localised deposition technique used, it is possible to contaminate the surroundings is also taken into account. Care is thus taken to choose a sufficient distance so as not to damage the structure of interest 3. If the extent of the damage caused by this deposition of material is not known, it is possible to firstly deposit the material of the reference structure 100b on an area of the surface of the sample 1 that is not used and is remote from the structure of interest 3. It is then possible to measure the contaminated zone and take into account this distance during the deposition of the material of the structure 100b near to the structure of interest 3 on the sample 1.

To form the reference structure 100b, preferably a deposition is carried out of a uniform thickness having the least topographies possible to avoid possible distortions of the images. This deposition may in particular be carried out over a height for example of between around 15 nm and 30 nm. Nevertheless, it is possible to carry out thicker depositions (for example between 30 nm and 200 nm, or even more) to form the reference structure 100b.

If the surface of the structure of interest to be observed is nevertheless contaminated or oxidised, said surface is cleaned by carrying out an ion bombardment under ultra-high vacuum in the spectromicroscope. Care is taken to ensure that the deposition of material of the reference structure 100b is not too thin, in other words of at least several nanometers thickness, so that it can withstand such an ion bombardment.

After having deposited the material of the reference structure 100b, a machining is carried out over a depth corresponding to the deposition height plus around 1 or 2 nm in order to be certain to machine up to the substrate 1, through the material of the reference structure 100b. To avoid topographic effects, care is taken to minimise the engraved thickness. The Simple deposition of material does not generally enable a neat and well defined structure to be obtained, which on the other hand may be obtained by carrying out a machining after the deposition of the material. This machining thus makes it possible, from the localised deposition of material, to form the different portions (102 and 104 in FIG. 4) of the reference structure 100b.

Given that the structure of interest 3 studied here is formed by a stack of epitaxied layers of Si and SiGe, the reference structure 100b is for example based on tungsten. Indeed, the work function of the material of the sample 1, here silicon, which is 4.85 eV, is different to that of tungsten which is 4.55 eV (difference of 0.3 eV). The cross section of the core level photoelectrons ejected from tungsten for an excitation energy of 1486.7 eV (AlKα type X-ray source) is equal to around 0.15 Mb.

Given that the X-ray source used here at 1486.7 eV makes it possible to obtain a spatial resolution of around 500 nm, it may be decided to form the reference structure 100b in the form of concentric rings arranged within each other according to a period of around 1 μm, the tungsten being deposited by FIB over a thickness equal to around 20 nm, then machined to form the concentric portions of the reference structure 100b.

Although the example of the reference structure 100b described previously comprises several portions of concentric material, it is also possible that the reference structure only comprises a single portion of material, since this single portion of material can be used to correct the astigmatism of the column. This is the case when the dimensions of the exterior contour of the reference structure, along two axes perpendicular in relation to each other and lying in a plane parallel to the surface of the sample, are substantially similar, as is the case for example for a disc (such as for example the reference structure 100a represented in FIG. 3), a square, or other regular geometric shape such as a polygon.

It is also possible, after the formation of the reference structure 100b, to form a cross mark on the surface of the sample 1, close to the reference structure 100b. Such a cross, preferably asymmetric, makes it possible to locate easily the reference structure 100b during the implementation of the imaging method. Indeed, when the surface of the sample 1 is imaged, one begins with wide fields of view (fields of view over several hundreds of micrometers) and it is difficult to locate the reference structure 100b. This cross thus allows the user to localise the area in which the reference structure 100b lies and, when the cross is asymmetrical, to know the direction in which to move the column 10 in relation to the sample 1 to find and image the reference structure 100b. In the example described here, this cross is formed by FIB deposition, and the size of the branches of the cross is equal to around 200 μm. Generally speaking, it is also possible to form a marking pattern of a shape other than a cross.

After having formed the reference structure 100b, it is verified that the reference structure 100b formed corresponds to the desired structure (dimensions, topographies, shape, etc.). Such verification is for example carried out by a complementary surface characterisation technique, for example of KFM (Kelvin force microscopy), AFM (atomic force microscopy) or SEM (scanning electron microscopy) type.

If the reference structure 100b formed corresponds to that desired, the sample 1 comprising the reference structure 100b is introduced into the spectromicroscope. From the cross mark, the position of the reference structure 100b is determined, then the reference structure 100b is imaged by wide field of view (for example 600 μm), for a given energy of secondary electrons. For each field of view chosen, the focusing and the deflection of the column 10 are adjusted.

The astigmatism, in observation with secondary electrons, may then be corrected. To do this, the focusing voltage of the spectromicroscope is oscillated. If the reference structure 100b appears deformed, the voltages of the axes Sx and Sy of the stigmator 18 are adjusted. The focusing voltage of the spectromicroscope is then rectified for the given energy.

It is then possible to change to medium fields of view (for example around 100 μm) and to carry oat a correction of astigmatism with secondary electrons and a correction of the deflection as described previously.

One then changes from imaging mode to spectroscopy mode.

A first spectrum is taken at low resolution to determine the elements present at the surface of the sample. It is thereby possible to determine the degree of contamination of the surface of the sample, and thus of the structure of interest 3, by the deposition of material during the formation of the reference structure 100b. For example, if a carbon peak is detected, an ion bombardment is carried out to strip the surface of the sample before carrying out a high resolution imaging of the core levels of the structure of interest 3. This first spectrum makes it possible to carry out an elementary quantitative analysis and to determine the lines of the elements of interest of the structure of interest 3, namely those in which one wishes to image the core levels.

To do this, a marking of the spectral lines of interest is firstly carried out. High resolution spectra of each of the lines of interest are then taken so as to have a refined measurement of the kinetic energy, and thus of the binding energy of the core level photoelectrons of the structure of interest 3 present on the sample 1.

Imagings are carried out at different kinetic energies in narrow field of view (for example less than around 25 μm), which implies a readjustment of the focusing voltage of the spectromicroscope. This voltage depends not only on the kinetic energy of the electrons, but also on the distance of the structure of interest 3 in relation to the lens-objective 14 of the column 10. After having found a focusing voltage for a given kinetic energy of the secondary electrons, another kinetic energy for filtering secondary electrons is chosen and the new focusing value is sought.

Figure 5:
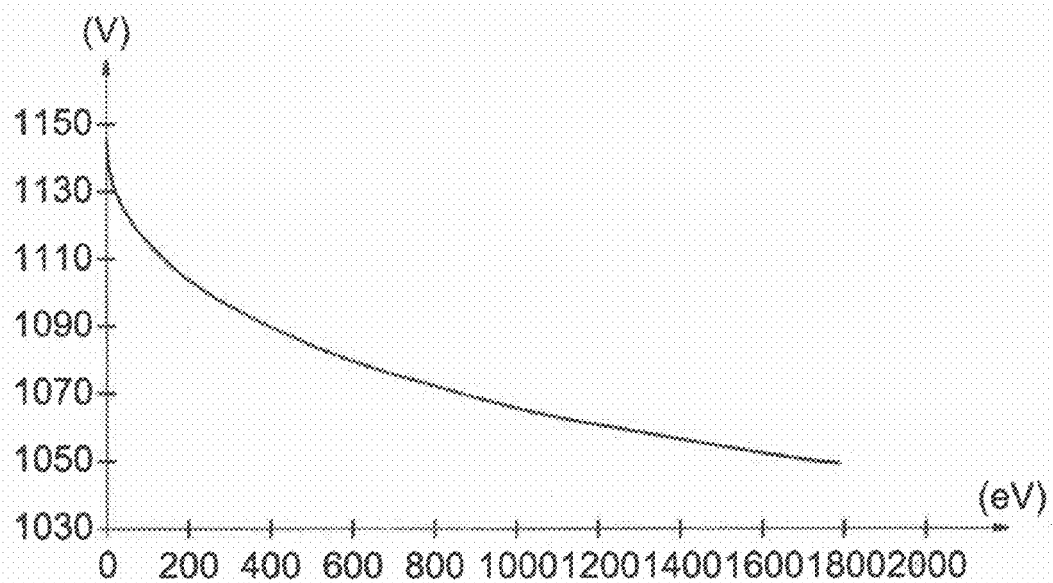
FIG. 5 represents an extrapolated curve expressing a variation in the focusing voltage of a spectromicroscope as a function of the kinetic energy of the electrons ejected during an imaging method, according to one embodiment.

An extrapolation of the curve obtained is then performed, for example by suitable software, giving the focusing voltage as a function of the binding energy (and thus of the kinetic energy) of the photoelectrons, to have an idea of the focusing voltage that will make it possible to carry out the core level photoelectron imaging of the structure of interest 3. Since more integration time is needed for the core levels, knowing in advance the correct focusing voltage makes it possible to reduce the time for carrying out the imaging method. FIG. 5 represents an example of curve obtained by such an extrapolation, giving the variation in the focusing voltage as a function of the kinetic energy of the photoelectrons.

For each line of interest, in other words for each filtering energy, whether for the reference structure 100b or the structure of interest 3, several images are produced for different focusing voltages on the core level photoelectrons to find the best focusing voltage.

After having determined said best focusing voltage, the core levels of the material of the reference structure 100b are then imaged and the astigmatism on it is corrected via the control voltages of the stigmator 18.

The astigmatism being corrected on the reference structure 100b, the field of view is displaced onto the structure of interest 3. A verification is performed on the focusing voltage by checking that it has not changed, and by correcting it if necessary. High resolution imagings on the core levels of the structure of interest 3 are then carried out.

By correcting firstly the astigmatism on secondary electron images, then on core level photoelectron images, the cancellation of astigmatism of the electronic optical column of the spectromicroscope is progressively refined.

The invention claimed is:

1. A method for correcting astigmatism of an electronic optical column of an electron emission spectromicroscope, comprising at least the steps of:
forming a reference structure on a surface of a sample comprising a structure of interest to be imaged, the dimensions of the exterior contour of the reference structure, along two axes perpendicular to each other and lying in a plane parallel to the surface of the sample, being substantially similar,
imaging the reference structure by the spectromicroscope with secondary electrons and with care level photoelectrons,
eliminating astigmatism defects appearing during the imaging of the reference structure with secondary electrons and with core level photoelectrons,
a material of the reference structure being chosen such that, during core level photoelectron imaging, the contrast C between the average intensity $I_a$ of the material of the reference structure and the average intensity $I_b$ of the material of the sample is such that:

$$C = \frac{I_a - I_b}{I_a + I_b} \geq 0.2.$$

2. The method for correcting astigmatism according to claim 1, wherein the reference structure comprises a plurality of portions of the material of the reference structure forming concentric patterns of different sizes and separated from each other by a non-zero distance.

3. The method for correcting astigmatism according to claim 2, wherein exterior contours of portions of material of the reference structure are homothetic to each other and/or extend 360° around the centre of the reference structure.

4. The method for correcting astigmatism according to claim 2, wherein the patterns of the portions of material of the reference structure comprise geometric patterns arranged within each other, or comprising a grid or spiral pattern.

5. The method for correcting astigmatism according to claim 2, wherein the patterns of the portions of material of the reference structure comprise rings.

6. The method for correcting astigmatism according to claim 2, wherein the distance between the portions of material of the reference structure and/or the width of the portions of material of the reference structure are greater than or equal to around twice the best spatial resolution of the spectromicroscope during an observation of the structure of interest.

7. The method for correcting astigmatism according to claim 1, wherein said dimensions of the exterior contour of the reference structure are at least equal to around $\frac{1}{25}^{th}$ of the size of the field of view of the spectromicroscope.

8. The method for correcting astigmatism according to claim 1, wherein the difference between the work function of the material of the reference structure and the work function of the material of the sample is greater than or equal to around 0.2 eV and/or, when the materials of the reference structure and the sample are based on at least one same element, the concentration of said element in the material of the reference structure is different from the concentration of this component in the material of the sample and/or, when the materials of the reference structure and the sample are of the same nature, said materials are doped differently.

9. The method for correcting astigmatism according to claim 1, wherein the cross section of a core level photoelectron of at least one constituent element of the material of the reference structure is greater than or equal to around 0.1 Mbarn.

10. The method for correcting astigmatism according to claim 1, wherein the kinetic energy of the core level photoelectrons used for imaging at least one of the constituent elements of the material of the reference structure is less than around 1000 eV.

11. The method for correcting astigmatism according to claim 1, wherein the formation of the reference structure comprises at least one step of localised deposition of the material of the reference structure on the sample at a distance greater than around 100 μm from the structure of interest, and a step of machining the deposited material, forming the reference structure.

12. The method for correcting astigmatism according to claim 11, wherein the material of the reference structure is deposited over a substantially uniform thickness between around 15 nm and 200 nm and/or the machining is carried out over a depth greater than around 1 nm or 2 nm in the thickness of the deposited material.

13. The method for correcting astigmatism according to claim 1, comprising, before the implementation of a step of imaging the reference structure by the spectromicroscope with core level photoelectrons then a step of eliminating astigmatism defects appearing during the core level photoelectron imaging of the reference structure, a step of imaging the reference structure by the spectromicroscope with secondary electrons, then a step of eliminating astigmatism defects appearing during the secondary electron imaging of the reference structure.

14. The method for correcting astigmatism according to claim 1, wherein an elimination of astigmatism defects appearing during the imaging of the reference structure with secondary electrons or with core level photoelectrons is carried out by an adjustment of control voltages of the axes of a stigmator of the column then by an adjustment of a focusing voltage of the spectromicroscope.

15. A method of electron emission spectromicroscopy imaging, comprising the implementation of a method for correcting astigmatism according to claim 1, and one or more steps of imaging the structure of interest with secondary electrons and/or with core level photoelectrons.

* * * * *